United States Patent
Coene

(12) 
(10) Patent No.: US 6,486,804 B2
(45) Date of Patent: Nov. 26, 2002

(54) METHOD OF CONVERTING A STREAM OF DATABITS OF A BINARY INFORMATION SIGNAL INTO A STREAM OF DATABITS OF A CONSTRAINED BINARY CHANNEL SIGNAL, DEVICE FOR ENCODING, SIGNAL COMPRISING A STREAM OF DATABITS OF A CONSTRAINED BINARY CHANNEL SIGNAL, RECORD CARRIER, METHOD FOR DECODING, DEVICE FOR DECODING

(75) Inventor: Willem Marie Julia Marcel Coene, Eindhoven (NL)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/853,185

(22) Filed: May 10, 2001

(65) Prior Publication Data

US 2001/0040518 A1 Nov. 15, 2001

(30) Foreign Application Priority Data

May 10, 2000 (EP) .............................................. 00201667

(51) Int. Cl.$^7$ ................................................. H03M 7/00
(52) U.S. Cl. .............................. 341/50; 341/58; 341/60; 341/102; 341/103; 341/106
(58) Field of Search ............................ 341/102, 59, 120, 341/159, 58, 60, 103, 106

(56) References Cited

U.S. PATENT DOCUMENTS

| | | | |
|---|---|---|---|
| 4,488,142 A | * 12/1984 | Franaszek | 341/59 |
| 5,136,436 A | 8/1992 | Kahlman | 360/40 |
| 5,696,505 A | 12/1997 | Schouhamer et al. | 341/59 |
| 5,781,131 A | * 7/1998 | Shimpuku et al. | 341/58 |
| 5,790,056 A | * 8/1998 | Schouhamer Immink | 341/58 |
| 5,969,651 A | * 10/1999 | Okazaki et al. | 341/106 |
| 6,002,718 A | * 12/1999 | Roth | 341/106 |
| 6,281,815 B1 | * 8/2001 | Shim et al. | 341/59 |
| 6,297,753 B1 | * 10/2001 | Hayami | 341/55 |
| 6,362,754 B1 | * 3/2002 | Van Dijk et al. | 341/59 |
| 6,404,355 B1 | * 6/2002 | Coene | 341/58 |

FOREIGN PATENT DOCUMENTS

| | | | |
|---|---|---|---|
| EP | 002007128 | 12/1986 | H02P/5/172 |
| WO | WO9963671 | 12/1999 | H03M/5/14 |

* cited by examiner

*Primary Examiner*—Michael Tokar
*Assistant Examiner*—Linh V Nguyen
(74) *Attorney, Agent, or Firm*—Michael E. Belk

(57) ABSTRACT

A method of converting a stream of databits of a binary information signal into a stream of databits of a constrained binary channel signal, a device for encoding, a signal, a record carrier, a method for decoding, and a device for decoding. The signal is constructed by repetitively or alternately using channel codes $C_1$ and $C_2$. Since two channel words with opposite parities are available in the channel code $C_2$ for each information word, and the same state is established, predetermined properties of the constrained binary channel signal can be influenced. Since the method further comprises the step of substituting, in dependence upon a value of a predetermined property of the binary channel signal, a channel word for a substitute channel word, wherein the substituted channel word and the substitute channel word establish the same state, predetermined properties of the constrained binary channel signal can be further influenced.

21 Claims, 25 Drawing Sheets

| state | words IN | words OUT |
|---|---|---|
| 1 | $-10^2 \mid$<br>$-10^3 \mid$<br>$-10^4 \mid$<br>$-10^5 \mid$<br>$-10^6 \mid$<br>$-10^7 \mid$<br>$-10^8 \mid$<br>$-10^9 \mid$<br>$-10^{10} \mid$ | $\mid 10^2 1-$<br>$\mid 10^3 1-$<br>$\mid 10^4 1-$<br>$\mid 10^8 1-$<br>$\mid 10^9 1-$ |
| 2 | $-10^2 \mid$<br>$-10^3 \mid$<br>$-10^4 \mid$<br>$-10^5 \mid$<br>$-10^6 \mid$<br>$-10^7 \mid$<br>$-10^8 \mid$<br>$-10^9 \mid$ | $\mid 10^5 1-$<br>$\mid 10^6 1-$<br>$\mid 10^7 1-$<br>$\mid 010^3 1-$<br>$\mid 010^4 1-$<br>$\mid 010^5 1-$<br>$\mid 010^6 1-$<br>$\mid 010^7 1-$<br>$\mid 010^8 1-$<br>$\mid 010^9 1-$<br>$\mid 010^{10} 1-$ |
| 3 | $-10^2 \mid$<br>$-10^3 \mid$<br>$-10^4 \mid$<br>$-10^5 \mid$<br>$-10^6 \mid$<br>$-10^7 \mid$<br>$-10^8 \mid$ | $\mid 10^{10} 1-$<br>$\mid 010^2 1-$<br>$\mid 0^2 1-$ |
| 4 | $-1 \mid$<br>$-10^1 \mid$<br>$-10^2 \mid$<br>$-10^3 \mid$<br>$-10^4 \mid$<br>$-10^5 \mid$ | $\mid 0^3 1-$<br>$\mid 0^4 1-$<br>$\mid 0^5 1-$ |
| 5 | $-1 \mid$<br>$-10^1 \mid$ | $\mid 0^2 1-$<br>$\mid 0^6 1-$<br>$\mid 0^7 1-$<br>$\mid 0^8 1-$ |
| 6 | $-10^1 \mid$ | $\mid 0^1 1-$<br>$\mid 0^9 1-$ |

FIG. 2

| state | words IN | words OUT |
|---|---|---|
| 1 | $-10^2\vert$ <br> $-10^3\vert$ <br> $-10^4\vert$ <br> $-10^5\vert$ <br> $-10^6\vert$ <br> $-10^7\vert$ <br> $-10^8\vert$ <br> $-10^9\vert$ <br> $-10^{10}\vert$ | $\vert 10^2 1-$ <br> $\vert 10^3 1-$ <br> $\vert 10^4 1-$ <br> $\vert 10^8 1-$ <br> $\vert 10^9 1-$ |
| 2 | $-10^2\vert$ <br> $-10^3\vert$ <br> $-10^4\vert$ <br> $-10^5\vert$ <br> $-10^6\vert$ <br> $-10^7\vert$ <br> $-10^8\vert$ <br> $-10^9\vert$ | $\vert 10^5 1-$ <br> $\vert 10^6 1-$ <br> $\vert 10^7 1-$ <br> $\vert 10^{10} 1-$ <br> $\vert 010^3 1-$ <br> $\vert 010^4 1-$ <br> $\vert 010^5 1-$ <br> $\vert 010^6 1-$ <br> $\vert 010^7 1-$ <br> $\vert 010^8 1-$ <br> $\vert 010^9 1-$ <br> $\vert 010^{10} 1-$ |
| 3 | $-10^2\vert$ <br> $-10^3\vert$ <br> $-10^4\vert$ <br> $-10^5\vert$ <br> $-10^6\vert$ <br> $-10^7\vert$ <br> $-10^8\vert$ | $\vert 010^2 1-$ <br> $\vert 0^2 1-$, but not: $\vert 0^2 10^7 10^2 1-$ |
| 4 | $-1\vert$ <br> $-10^1\vert$ <br> $-10^2\vert$ <br> $-10^3\vert$ <br> $-10^4\vert$ <br> $-10^5\vert$ | $\vert 0^2 10^7 10^2 1-$ <br> $\vert 0^3 1-$ <br> $\vert 0^4 1-$ <br> $\vert 0^5 1-$ |
| 5 | $-1\vert$ <br> $-10^1\vert$ | $\vert 0^2 1-$, but not: $\vert 0^2 10^7 10^2 1-$ <br> $\vert 0^6 1-$ <br> $\vert 0^7 1-$ <br> $\vert 0^8 1-$ |
| 6 | $-10^1\vert$ | $\vert 0^1 1-$ <br> $\vert 0^9 1-$ |

| | 1 | | 2 | | 3 | | 4 | | 5 | | 6 | |
|---|---|---|---|---|---|---|---|---|---|---|---|---|
| 0 | 10000100001000 | 4 0 | 10000010010010 0 | 1 0 | 01001001001001 | 4 0 | 00010010010000 | 1 0 | 00000010010000 | 1 0 | 01001001001001 | 4 0 |
| 1 | 10000100001000 | 0 1 | 10000010010010 0 | 0 2 | 01001001001001 | 0 5 | 00010010010000 | 0 2 | 00000010010000 | 0 2 | 01001001001001 | 0 5 |
| 2 | 10000100001000 | 0 0 | 10000010010010 0 | 0 0 | 01001001001000 | 0 0 | 00010010010000 | 0 0 | 00000010010000 | 0 0 | 01001001001000 | 0 0 |
| 3 | 10000100001000 | 2 0 | 10000010010010 0 | 3 0 | 01001001001000 | 1 0 | 00010010010000 | 3 0 | 00000010010000 | 3 0 | 01001001001000 | 1 0 |
| 4 | 10010100010010 | 0 0 | 10000010010010 0 | 0 4 | 01001001001000 | 0 2 | 00010010010010 | 0 0 | 00000010010010 | 0 4 | 01001001001000 | 0 2 |
| 5 | 10010100010010 | 3 0 | 10000010010010 0 | 0 0 | 01001001001000 | 0 0 | 00010010010010 | 4 0 | 00000010010010 | 0 0 | 01001001001000 | 0 0 |
| 6 | 10010100010010 | 0 4 | 10000010010001 0 | 4 0 | 01001001000100 | 3 0 | 00010010010010 | 0 4 | 00000010010010 | 4 0 | 01001001000100 | 3 0 |
| 7 | 10010100010001 | 0 0 | 10000010010001 0 | 0 0 | 01001001000100 | 0 0 | 00010010010001 | 0 0 | 00000010010001 | 0 0 | 01001001000100 | 0 0 |
| 8 | 10010100010001 | 0 5 | 10000010010000 0 | 0 5 | 01001001000100 | 0 4 | 00010010010001 | 5 0 | 00000010010001 | 0 5 | 01001001000100 | 0 4 |
| 9 | 10010100010000 | 0 0 | 10000010010000 0 | 6 0 | 01001001000010 | 0 0 | 00010010010000 | 0 6 | 00000010010000 | 0 6 | 01001001000010 | 0 0 |
| 10 | 10010100010000 | 0 0 | 10000010010000 0 | 0 0 | 01001001000010 | 4 0 | 00010010010000 | 0 0 | 00000010010000 | 0 0 | 01001001000010 | 4 0 |
| 11 | 10010100010000 | 4 0 | 10000010010000 0 | 0 5 | 01001001000010 | 0 0 | 00010010010000 | 4 0 | 00000010010000 | 0 5 | 01001001000010 | 0 0 |
| 12 | 10010100010000 | 0 0 | 10000010010000 0 | 0 6 | 01001001000001 | 5 0 | 00010010010000 | 0 0 | 00000010010000 | 0 6 | 01001001000001 | 5 0 |
| 13 | 10010100001001 | 0 5 | 10000010010010 0 | 4 0 | 01001001000001 | 0 0 | 00010010001001 | 5 0 | 00000010000101 | 4 0 | 01001001000001 | 0 0 |
| 14 | 10010100001001 | 0 0 | 10000010010010 0 | 0 5 | 01001001000001 | 0 5 | 00010010001001 | 0 0 | 00000010000101 | 0 5 | 01001001000001 | 0 5 |

| # | | | | | | |
|---|---|---|---|---|---|---|
| 135 | 100010010001000 | 010000100100010 | 001001000000010 | 000010010001000 | 001001000000010 | 010000100100010 |
| 136 | 100010010001000 | 010000100100010 | 001001000000010 | 000010010001000 | 001001000000010 | 010000100100010 |
| 137 | 100010010000100 | 010000100100010 | 001001000000001 | 000010010000100 | 001001000000001 | 010000100100010 |
| 138 | 100010010000100 | 010000100100001 | 001001000000001 | 000010010000100 | 001001000000001 | 010000100100001 |
| 139 | 100010010000100 | 010000100100001 | 001001000000000 | 000010010000100 | 001001000000000 | 010000100100001 |
| 140 | 100010010000100 | 010000100100000 | 001001000000000 | 000010010000100 | 001001000000000 | 010000100100000 |
| 141 | 100010010000010 | 010000100100000 | 001001000100100 | 000010010000010 | 001001000100100 | 010000100100000 |
| 142 | 100010010000010 | 010000100100000 | 001001000100100 | 000010010000010 | 001001000100100 | 010000100100000 |
| 143 | 100010010000010 | 010000100100000 | 001001000100100 | 000010010000010 | 001001000100100 | 010000100100000 |
| 144 | 100010010000001 | 010000100010010 | 001001000100010 | 000010010000001 | 001001000100010 | 010000100010010 |
| 145 | 100010010000001 | 010000100010010 | 001001000100010 | 000010010000001 | 001001000100010 | 010000100010010 |
| 146 | 100010010000000 | 010000100010010 | 001001000100010 | 000010010000000 | 001001000100010 | 010000100010010 |
| 147 | 100010010000000 | 010000100010001 | 001001000100001 | 000010010000000 | 001001000100001 | 010000100010001 |
| 148 | 100010010000000 | 010000100010001 | 001001000100001 | 000010010000000 | 001001000100001 | 010000100010001 |
| 149 | 100010001001001 | 010000100010000 | 001001001000000 | 000010001001001 | | |

| | | | | | | | | | | |
|---|---|---|---|---|---|---|---|---|---|---|
| 255 | 1000000000100010 | 6 0 0 | 1000000001000010 | 6 0 0 | 0010000000000100 | 2 0 0 | 0000001000000010 | 4 0 0 | 0010000000000100 | 2 0 0 | 0000000000100001 | 4 0 0 |

FIG. 4R

EFMCC : SDCC - Adapted State - Decoding Main Code

| Previous Word | Present Word | State | |
|---|---|---|---|
| — * * | 1 0 0 1 — | 1 | $10^21-$ |
| — * * | 1 0 0 0 1 — | 1 | $10^31-$ |
| — * * | 1 0 0 0 0 1 — | 1 | $10^41-$ |
| — * * | 1 0 0 0 0 0 1 — | 2 | $10^51-$ |
| — * * | 1 0 0 0 0 0 0 1 — | 2 | $10^61-$ |
| — * * | 1 0 0 0 0 0 0 0 1 — | 2 | $10^71-$ |
| — * * | 1 0 0 0 0 0 0 0 0 1 — | 1 | $10^81-$ |
| — * * | 1 0 0 0 0 0 0 0 0 0 1 — | 1 | $10^91-$ |
| — * * | 1 0 0 0 0 0 0 0 0 0 0 1 — | 3 | $10^{10}1-$ ← |
| — 0 0 | 0 1 0 0 0 — | 2 | 0 1 0 0 0 — |
| — 0 0 | 0 1 0 0 1 — | 3 | $010^21-$ |
| — 1 0 | 0 1 — | 6 | 0 1 — |
| — 0 0 | 0 0 1 — | 3 | $0^21-$ |
| — 0 1 | 0 0 1 — | 5 | $0^21-$ |
| — 1 0 | 0 0 1 — | 5 | $0^21-$ |
| — 0 0 0 0 0 0 | 0 0 0 1 — | 1 | $0^31-$ |
| else | 0 0 0 1 — | 4 | $0^31-$ |
| — 0 0 0 0 0 0 | 0 0 0 0 1 — | 1 | $0^41-$ |
| else | 0 0 0 0 1 — | 4 | $0^41-$ |
| — * * | 0 0 0 0 0 1 — | 4 | $0^51-$ |
| — 0 1 | 0 0 0 0 0 0 1 — | 5 | $0^61-$ |
| — 1 0 | 0 0 0 0 0 0 1 — | 5 | $0^61-$ |
| — 0 0 | 0 0 0 0 0 0 1 — | 4 | $0^61-$ |
| — 0 1 | 0 0 0 0 0 0 0 1 — | 5 | $0^71-$ |
| — 1 0 | 0 0 0 0 0 0 0 1 — | 5 | $0^71-$ |
| — 0 0 | 0 0 0 0 0 0 0 1 — | 4 | $0^71-$ |
| — 0 1 | 0 0 0 0 0 0 0 0 1 — | 5 | $0^81-$ |
| — 1 0 | 0 0 0 0 0 0 0 0 1 — | 5 | $0^81-$ |
| — 0 0 | 0 0 0 0 0 0 0 0 1 — | 4 | $0^81-$ |
| — * * | 0 0 0 0 0 0 0 0 0 1 — | 6 | $0^91-$ |
| 6 bit | 12 bit | | |

FIG. 5

METHOD OF CONVERTING A STREAM OF DATABITS OF A BINARY INFORMATION SIGNAL INTO A STREAM OF DATABITS OF A CONSTRAINED BINARY CHANNEL SIGNAL, DEVICE FOR ENCODING, SIGNAL COMPRISING A STREAM OF DATABITS OF A CONSTRAINED BINARY CHANNEL SIGNAL, RECORD CARRIER, METHOD FOR DECODING, DEVICE FOR DECODING

FIELD OF THE INVENTION

The invention relates to a method of converting a stream of databits of a binary information signal into a stream of databits of a constrained binary channel signal, wherein the stream of databits of the binary information signal is divided into n-bit information words, said information words being converted into $m_1$-bit channel words in accordance with a channel code $C_1$, or $m_2$-bit channel words in accordance with a channel code $C_2$, where $m_1$, $m_2$ and n are integers for which it holds that $m_2 > m_1 \geq n$, wherein the $m_2$-bit channel word is chosen from at least two $m_2$-bit channel words at least two of which have opposite parities, the concatenated $m_1$-bit channel words and the $m_2$-bit channel words complying with a runlength constraint of the binary channel signal, the method comprising the repetitive and/or alternate steps of:

selecting the $m_1$-bit channel word from a set out of a plurality of sets of $m_1$-bit channel words, each set comprising only $m_1$-bit channel words having a beginning part out of a subset of beginning parts of the $m_1$-bit channel words, each set being associated with a coding state of channel code $C_1$, the coding state being established in dependence upon an end part of the preceding channel word, or:

selecting the $m_2$-bit channel word from a set out of a plurality of sets of $m_2$-bit channel words, each set comprising only $m_2$-bit channel words having a beginning part out of a subset of beginning parts of the $m_2$-bit channel words belonging to said set, each set being associated with a coding state of channel code $C_2$, the coding state being established in dependence upon an end part of the preceding channel word, the end parts of the $m_1$-bit channel words in a coding state of channel code $C_1$ and the beginning parts of the $m_2$-bit channel words in a set of channel code $C_2$ being arranged to comply with said runlength constraint.

SUMMARY OF THE INVENTION

The invention also relates to a device for encoding, a signal comprising a stream of databits of a constrained binary channel signal, a record carrier, a method for decoding and a device for decoding.

The non-prepublished, co-pending European Patent Application no. 00200712.8 (PH-NL000074) describes a constrained binary channel signal which is constructed by repetitively or alternate using a channel code $C_1$ and a channel code $C_2$. Due to the fact that two channel words with opposite parities are available in the channel code $C_2$ for each information word, predetermined properties of the constrained binary channel signal can be influenced, e.g. for performing guaranteed DC-control. No additional DC-control on top of this guaranteed DC-control is performed. It may be advantageous to be able to create this additional DC-control.

The invention has for an object to further influence predetermined properties of the above-mentioned constrained binary channel signal, e.g. for performing additional DC-control.

The method according to the invention comprises the step of substituting, in dependence upon a value of a predetermined property of the binary channel signal, a channel word for a substitute channel word so as to influence the value of the predetermined property of the binary channel signal, wherein the substituted channel word and the substitute channel word establish the same state.

This process of substituting channel words can only be performed for a limited number of entries in the code table. By substituting a limited number of channel words for substitute channel words, stochastic DC-control can be accomplished, for instance, if the substitutions cause a parity inversion. Stochastic control is understood to be the kind of control in which the actual use of this control via substitution depends on the actual data content (information words) that enters the encoder. The choice whether to perform a substitution can be carried out on the basis of the value of a predetermined property of the binary channel signal, e.g. based on an RDS-related criterion or a DSV-related criterion. RDS stands for "Running Digital Sum". By controlling this RDS, the suppression of lowfrequency components or DC-control can be accomplished. DSV stands for "Digital Sum Variation", indicating the total number of sum values a binary channel signal assumes. The choice whether to perform a substitution can be made in dependence upon the value of any predetermined property of the binary channel signal one wants to influence (e.g. the generation of pilot tracking tones, refer to U.S. Pat. No. 5,136,436 (PHN 12533)).

The invention is based on the recognition that, in the design of the channel code based on the combination of two codes $C_1$ and $C_2$ (refer to the non-prepublished, co-pending European Patent Application no. 00200712.8 (PH-NL000074)), there is some extra room for the introduction of stochastic control on top of the guaranteed control. This extra room is exploited in that a limited number of channel words is substituted for other substitute words in order to be able to influence predetermined properties of the binary channel signal. Substitution of channel words also relates to the substitution of a part of a channel word. In order to guarantee, for instance, a DC-control of a predetermined performance level in the channel code based on the combination of the two codes $C_1$ and $C_2$, the substitutions, i.e. the combination of substituted channel word and substitute channel word, must have the property that both the substituted channel word and the substitute channel word establish the same state.

In another method according to the invention, the step of substituting a channel word for a substitute channel word comprises different types of substitutions.

The available room in the design of the above-mentioned channel code can be used to introduce different types of substitutions. In this way, substitutions are created, for more information words thereby increasing the stochastical control on the binary channel signal.

In another method according to the invention, maximally one type of substitution occurs for each information word.

It is advantageous to introduce maximally one type of substitution for each information word. In this way, the available substitutions are better "spread" over the information words, thereby increasing the stochastic control on the binary channel signal.

In another method according to the invention, the substitute channel word does not belong to the sets of channel words of channel codes $C_1$ or $C_2$.

This first substitution type is based on the fact that, in this channel code, some specific channel words do not occur in the channel bitstream under normal application of the channel code; these channel words can be used as substitute channel words. By substituting a limited number of channel words for substitute channel words not belonging to the channel words present in the binary channel signal before the substitutions, additional, stochastic DC-control can be accomplished.

In another method according to the invention, the substitute channel word is omitted from the sets of channel words of channel codes $C_1$ or $C_2$ in view of a constraint on the number of successive xT runlengths in the binary channel signal. In an embodiment, x=3. In another embodiment, the number of successive xT runlengths is 6.

This second substitution type is based on the fact that some channel words, which are initially omitted in view of an RMTR constraint, can be used as substitutions on the condition that concatenation with the previous channel word does not lead to a violation of this RMTR constraint. RMTR stands for "Repeated Minimum Transition Runlength". An RMTR=6 constraint e.g. implies that the number of successive 3T runlengths in the sequence of channel words is limited to 6. More information about this constraint can be found in published patent application WO99/63671-A1 (PHQ 98.023).

In another method according to the invention, the substitute channel word is chosen from one set of a plurality of sets of channel words, the set being associated with a coding state different from the coding state the substituted channel word was in.

This third substitution type is due to the fact that, due to the structure of the channel code, it is possible to "swap" between coding states conditionally, which means that the "swap" can only be done for some channel words. "Swap" is understood to mean that the substitute channel word used in the binary channel signal is chosen from a coding state different from the coding state the substituted channel word is in. If the parity of the substituted channel word is different from the parity of the substitute channel word, room for extra influence of predetermined properties of the binary channel signal is created.

BRIEF DESCRIPTION OF DRAWINGS

These and other aspects of the invention will be further described in the Figure description, in which, FIG. 2 shows an example of the state characterisation of a 6-state Finite-State-Machine to be used for the main code (channel code $C_1$), aimed for the channel constraints d=2, k=10, FIG. 3 shows an example of the state characterisation of a 6-state Finite-State-Machine to be used for the dual code (channel code $C_2$), aimed for the channel constraints d=2, k=10, FIG. 4 shows the code table of the main code $C_1$, FIG. 5 shows an example of how decoding of the next-state function of the channel words of the main code is performed.

DETAILED DESCRIPTION OF THE INVENTION

Figure 1:
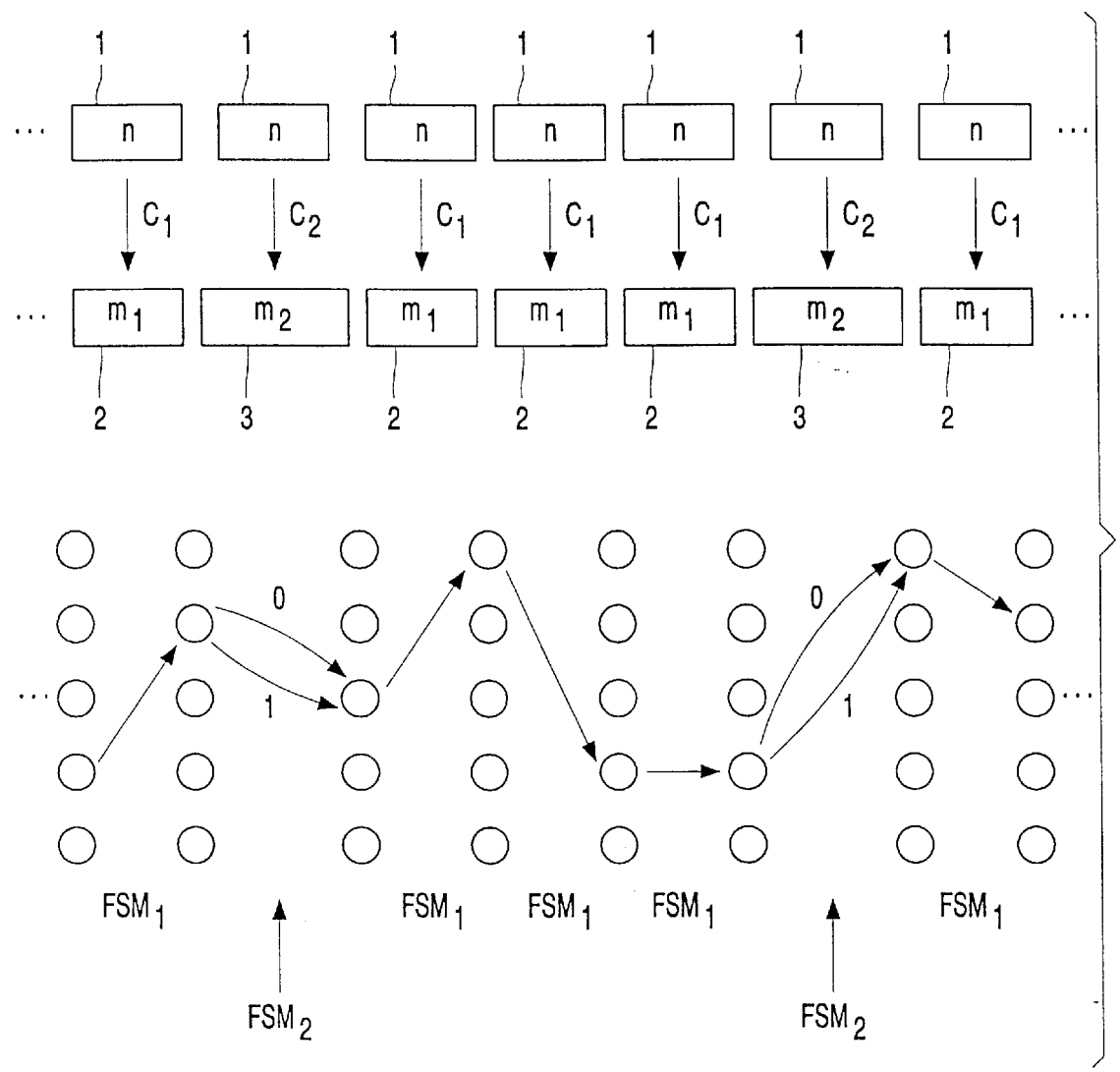
FIG. 1 shows an example of the coding method according to the co-pending European Patent Application, Application no. 00200712.8 (PH-NL000074)

FIG. 1 shows graphically an example of the coding method. Using this method predetermined properties of the binary channel signal can be influenced, for example for guaranteed DC-control via the alternation of two codes $C_1$ and $C_2$ via an alternation pattern that is also known at the decoder.

We consider two channel codes, $C_1$ and $C_2$. Both codes are applied on n-bit symbols. Channel code $C_1$ is a high-rate code with n-to-$m_1$ mapping; channel code $C_2$ is a low-rate code with n-to-$m_2$ mapping. In this example, for d=2, k=10, $C_1$ has a 8-to-15 mapping, and $C_2$ has a 8-to-17 mapping (n=8, $m_1$=15, $m_2$=17). Guaranteed DC-control, i.e. DC-control for every possible sequence of information words, is achieved if the following conditions are satisfied: for each n-bit symbol, channel code $C_2$ has two channel words, one with even and one with odd parity in order to influence the RDS-value of the binary channel signal; for each n-bit symbol, the two possible channel representations of code $C_2$ have the same next-state. The Finite-State-Machines (FSMs) of codes $C_1$ and $C_2$, indicating the states and state characterisations of the channel codes $C_1$ and $C_2$, have the same number of states, and the FSMs are based on the same approximate eigenvector (according to Franazek's definition, see §5.3.1. of the book "Codes for mass data storage systems", K. A. Schouhamer Immink, November 1999, Shannon Foundation Publishers (ISBN-90-74249-23-X), which implies that channel words ending with a given number of zeroes have a certain multiplicity, irrespective of the fact whether they are part of a channel word from the main code $C_1$ or from the dual code $C_2$. The approximate eigenvector in this case of d=2, k=10 which satisfies an approximate eigenvector inequality is the following: $V_{(d=2, k=10)}$={2,3,4,4,4,3,3,3,2,1}.

However, the characterisation of the states of $FSM_1$ for $C_1$ and $FSM_2$ for $C_2$ may be different. These state characterisations are chosen in order to realise the constraints imposed on the binary channel signal. These constraints can be, for example, runlength-limiting constraints (d, k) or an RMTR constraint. In this way, the constraints imposed on the binary channel signal, formed by concatenating the $m_1$-bit channel words and the $m_2$-bit channel words, are satisfied. We can call channel code $C_1$ the main code, whereas channel code $C_2$ is referred to as the dual code. The upper part of FIG. 1 depicts an n-bit information word 1 which converted into an $m_1$-bit channel word 2 via a channel $C_1$ or into an $m_2$-bit channel word 3 via a channel code $C_2$.

The two available $m_2$-bit channel words are indicated in FIG. 1 by the corresponding parities, "0" and "1". The arrows in the lower part of this Figure depict the "flow" through the coding states of the Finite-State-Machines $FSM_1$ and $FSM_2$ when converting the information words. It can be seen that when converting an information word into an $m_1$-bit channel word, only one arrow points from the coding state of the channel word to the coding state of the next channel word, whereas when converting an information word into an $m_2$-bit channel word, two arrows point from the coding state of the channel word to the coding state of the next channel word, indicating the choice between the two available $m_2$-bit channel words.

The lower part of FIG. 1 depicts that for each information word (256 entries as the information words are 8 bits long, n=8) two $m_2$-bit channel words are available with opposite parities and with the same next-state. When converting an n-bit information word into an $m_2$-bit channel word, this $m_2$-bit channel word can be chosen from the two available $m_2$-bit channel words. In this example, this choice in used to create a DC-balanced or DC-free channel code.

FIG. 2 shows an example of the state characterisation for a 6-state Finite-State-Machine to be used for the main code (channel code $C_1$). In this example the channel constraints to be complied with are d=2 and k=10 and the channel code $C_1$ has a 8–15 mapping. FIG. 3 shows an example of the state characterisation of a 6-state Finite-State-Machine to be used for the dual code (channel code $C_2$). In this example the channel constraints to be complied with are d=2 and k=10 and the channel code $C_2$ has a 8–17 mapping.

In these Figures, a notation of "$-10^2|$", as can be found in the column words IN in state 1 of the main code, indicates all channel words with an ending "100". In the same way "$|010^{10}1-$", as can be found in the column words OUT of state 2 of the main code, indicates all channel words with a beginning "0100000000001".

The Finite-State-Machines (FSMs) of codes $C_1$ and $C_2$ have the same number of states, and the FSMs are based on the same approximate eigenvector, which implies that channel words ending with a given number of zeroes have a certain multiplicity, irrespective of the fact whether they are part of a channel word from the main code $C_1$ or from the dual code $C_2$. In the FSM of the dual code $C_2$, each branch leaving a state corresponds to two possible channel words (word-pair) with i) opposite parity and ii) the same next-state. The FIGS. 2 and 3 show that the multiplicity of any channel word in the 6-state FSMs ranges between 1 and 4.

A lot of channel words or word-pairs are used more than once across different states. By appropriate mating, i.e. grouping of the same combination of channel words or word-pairs together with next-states to one single table entry for more than one state, error propagation can be reduced because a precise distinction of the states leading to the given channel word, has become irrelevant for these channel words or word pairs. In fact, the codes $C_1$ and $C_2$ allow full state-independent decoding.

The skilled person is familiar with channel codes comprising different states, the states forming a Finite-State-Machine. Detailed information on state-coding can be found in literature, for example in European Patent Specification EP 0 745 254 B1 (PHN 14.746) or in the book "Codes for mass data storage systems", K. A. Schouhamer Immink, November 1999, Shannon Foundation Publishers (ISBN-90-74249-23-X).

In §5.3 of this book it is explained that, in order to be able to construct a sequence of channel words complying with the constraints imposed on a channel code, at least M words that terminate at the same or other principal states must emanate from each coding state. The existence of a set of coding states is therefore a necessary condition for the existence of a code for the specified number of information words (256 in case of an 8-bit information word). It can be shown that if an approximate eigenvector satisfies an approximate eigenvector inequality, then a fixed-length code with the predetermined constraints and other parameters of the code can be ascertained. More details can be found in §5.3.1 of this book and in the literature references therein.

The coding method in the above example has the following parameters: d=2, k=10, n=8, $m_1$=15, $m_2$=17; a skilled person can, without using inventive measures, apply the teaching of this method to generate binary channel signal with, for example, d=2, n=7 or d=2 or n=13. He can, for example, also generate a binary channel signal with a d=1 constraint. FIG. 4 shows the code table of the main code (channel code $C_1$), d=2, k=10, RMTR=6, with the entry index representing the index of the 8-bit information symbol (0–255). The six columns represent the six states of the main code. For each entry, one 15-bit long channel word is listed together with the corresponding next-state. In this code table the different types of substitution are incorporated. These different types are elucidated below.

In the example coding table of FIG. 4 the code table has three rows for each information word (indicated with numbers 0–255). The first row contains the standard channel words, which are used if no substitutions can be performed. The second row contains the surplus channel words that are possible without any condition. These channel words can be used as substitute channel words for performing the substitution of the first type. The third row contains channel words that are valid substitutions only if the RMTR=6 constraint is not violated upon concatenation with the previous channel word. These channel words can be used as substitute channel words for performing the substitution of the second type.

The code construction of the channel code (indicated with EFMCC, for EFM-Combi Code) allows for additional influencing predetermined properties of the binary channel signal, e.g. for DC-control of stochastic nature, on top of the guaranteed DC-control. As an example, only stochastic DC-control (SDCC) for the main code $C_1$ of EFMCC is considered, but the invention is not limited to this example. We distinguish three types of SDCC:

The first type is related to the surplus words of the main code $C_1$, the number of which is for states 1 up to 6: {15,3,5,6,0,5}, i.e., a total of 34 surplus words. These words can be used unconditionally. These surplus words can be found in the second row of the code table in FIG. 4. For example for state 6, the 5 surplus words can be found at the information words 224, 248, 249, 250 and 251.

The second type of SDCC is related to channel words that have been omitted in view of the RMTR=6 constraint. Some of these channel words can be used conditionally as substitutions, i.e., on condition that concatenation with the previous word does not lead to a violation of the RMTR constraint. In this example, the channel words that would require a check on the RMTR constraint upon concatenation with the next channel word are omitted. The number of surplus words of the second type are for the different states: {9,0,0,0,4,6}, i.e., a total of 19 surplus words. These surplus words can be found in the third row of the code table in FIG. 4. For example for state 1, the 9 surplus words can be found at the information words 205, 206, 216, 217, 218, 219, 220, 221 and 222.

The third type of SDCC is related to two "state-swaps" that are based on the structure of the FSM of EFMCC. A first state-swap is possible from state 4 towards state 5 for those situations where the previous channel word has n trailing zeroes, $2 \leq n \leq 4$, and where the present channel word has a characteristic bit-pattern at the beginning of the word: $-10^n|0^3 10^m 1-$ may be converted into $-10^n|0^{m+4}1-$ for $2 \leq m \leq 6-n$. Note that the border of a channel word is denoted by $|$. For state-independent decoding, the corresponding channel words for states 4 and 5 have to refer to the same byte-value and the code table has been arranged accordingly. The conditional state-swap from state 4 to state 5 is possible for 85 entries in the coding table of the main code $C_1$. A second state-swap is possible from state 1 towards state 4 for those situations where the previous channel word has n trailing zeroes, $6 \leq n \leq 7$, and where the present channel word has a characteristic bit-pattern at the beginning of the word: $-10^n|10^m1-$ may be converted into $-10^n|0^{m+1}1-$ for $2 \leq m \leq 9-n$. The corresponding channel words for states 1 and 4 have to refer to the same byte-value. The conditional state-swap from state 1 to state 4 is possible for 192 entries in the coding table of the main code $C_1$. Examples of the first state-swap (from state 4 towards state 5) can be found in the coding table at the information words 0, 1, 2, 3 and 4. Examples of the second state-swap (from state 1 towards state 4) can be found in the coding table at the information words 4, 5 and 6.

It must be noted that for all substitute channel words in this example, the following conditions are fulfilled:—a substitute channel word has a parity opposite to that of the substituted channel word;—both the substituted word and the substitute word have the same next-state in the FSM. Due to the fact that these conditions are fulfilled, the bytes that are to be encoded with the main code $C_1$, and that allow for a substitution of stochastic type (SDCC), can play exactly the same role as the bytes that are to be encoded with the substitution code $C_2$.

It must also be noted that not only the "character" of the channel word is deciding for which substitution may be suited, also the coding state the channel word is in is of influence. This can for example be seen at the information words 54 and 252. At these information words, in state 3 and state 6 the same channel word is present, namely 010010010010000 respectively 010010010010001. Due to the structure of the FSM for state 3, these channel words make possible a substitution of the first type, i.e. they can be used unconditionally, while these same channel words in state 6, make possible a substitution of the second type, i.e. they can not be used unconditionally in view of the RMTR-constraint and the fact that words entering state 6 have 1 trailing zero.

In FIG. 5 is shown an example of how decoding of the next-state function of the channel words of the main code is performed. When decoding a channel word, either from the main code $C_1$ or from the dual code $C_2$, into an 8-bit information word, no knowledge of the current state is needed. Therefore, this decoding is called state-independent decoding. On the other hand, knowledge of the next-state is needed is order to be able to uniquely decode the channel words in the case of multiple occurrence of the given channel word. In fact, a code word is uniquely represented not only by the given channel word, but by the combination of channel word and next-state. Therefore state-independent decoding is guaranteed if any combination of channel word and next-state only occurs within the three rows for one single entry. For different states and the same entry, the same combination of channel word and next-state may occur across different rows.

In FIG. 4 it can be seen that the coding table contains channel words which are used more than once, but these channel words are used at the same information word in order to guarantee state-independent decoding. Examples of this kind can be found in the coding table at the information words 54, 82 and 87.

In FIG. 5 it can be seen that for determination of the next-state a decoding window with a decoder look-ahead of at maximum 12 bits into the next channel word must be performed, in case that the next channel words is encoded with the main code $C_1$. The entry in the table of FIG. 5 where this maximum decoder look-ahead is necessary is indicated with an arrow. This decoder look-ahead must not be confused with the look-ahead encoding for improved DC-control. The asterisks in FIG. 5 indicate that all possible bit-combinations are allowed, as long as the imposed constraints are met.

When decoding the channel words into the information words, a so-called hashing-technique can be used, as will be explained below. Using this technique results in a reduced hardware complexity, i.e. a smaller number of gates, necessary to implement the decoder algorithm. We will describe one particular implementation in more detail. Decoding the channel words of the main code, using the hashing technique is performed as follows. Via enumerative decoding for d=2 the 15-bit channel word is converted into a 9-bit word by 15-to-9 mapping. Enumerative decoding is decoding in which the channel words to be decoded are computed by an algorithmic procedure based on the d=2 constraint instead of storing all the channel words in a table (for more information about enumerative coding refer to chapter 6 of the book "Codes for mass data storage systems", K. A. Schouhamer Immink, November 1999, Shannon Foundation Publishers, ISBN-90-74249-23-X). The number of the next-state is decoded via 2-bit coding in 2 bits because the maximum multiplicity of channel words equals 4. The 9-bit word and the 2-bit state word results in an 11-bit index. This 11-bit index is converted into the 8-bit information word with a hashing table for the main code, this hashing table comprising a table with at maximum 2048 entries ($=2^{11}$) (state-independent decoding).

Figure 6:
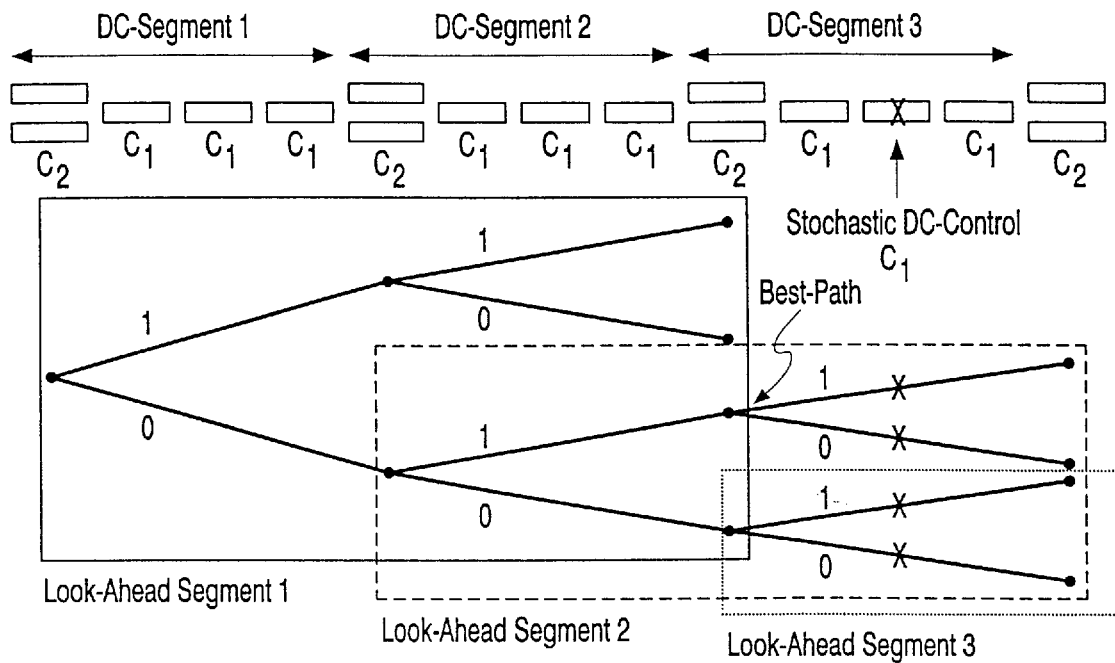
FIG. 6 shows a RDS-tree to be used for performing DC-control.

In FIG. 6 a RDS-tree to be used for performing DC-control is shown. RDS stands for the Running Digital Sum, which is a measure of the DC-content of the binary channel signal. As said before, for each $m_2$-bit channel word to be encoded, guaranteed DC-control can be performed. In order to realise the most effective DC-control, it is advisable to "look-ahead" in order to determine which choice of $m_2$-bit channel word, out of the two available $m_2$-bit channel words, results in the best RDS-value. As can be seen in FIG. 6, in order to be able to look-ahead N decisions, $2^N$ possible paths of the RDS-tree must be calculated. For N=2, 4 possible paths must be calculated.

FIG. 6 shows the decision tree with depth N, as it applies in general, i.e. both to the encoding along the distinct paths and to the evaluation criterion.

Considering the look-ahead decision tree, we can distinguish guaranteed nodes (use of $C_2$) and stochastic nodes (use of $C_1$ with stochastic DC-control according to one of the substitution types as explained with reference to FIG. 4). In this embodiment the look-ahead tree is based only on the guaranteed nodes. For the stochastic nodes, an immediate decision (for which word to choose, the substitute one or the substituted one) is made on the basis of the best path in the RDS-tree. In this way, the length of the look-ahead encoding paths in the RDS-tree is always fixed, which is advantageous for a real-time encoder. Three successive stages of the look-ahead decision tree are shown in FIG. 6. The first stage has a all tree without any stochastic node. In the subsequent stage, the tree encounters a new DC-control segment with one byte that yields a stochastic node. That byte is marked with an "X". Note that it can be allowed that different choices are made for byte "X" dependent on the branches "0" and "1" related to the choice at the dual code $C_2$. The use of the additional stochastic DC-control does not influence the property of state-independent decoding of the channel code with channel code $C_1$ and $C_2$, and error propagation remains at most one byte.

Figure 7:
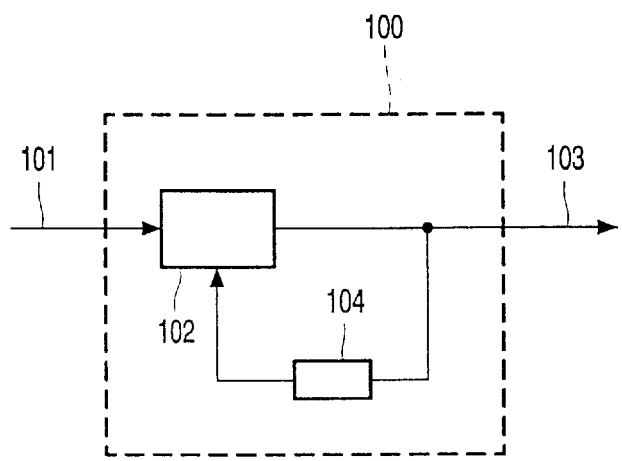
FIG. 7 shows a device for encoding.

FIG. 7 shows a device for encoding according to the invention. In this encoding device 100, a stream of databits of a binary information signal 101 is converted into a stream of databits of a constrained binary channel signal 103. The encoding device 100 comprises a converter 102 for converting the n-bit information words to $m_1$-bit channel words and for converting the n-bit information words to $m_2$-bit channel words, according to the coding method, for example according to the code table of the main code $C_1$ (shown in FIG. 4) and the dual code $C_2$. The encoding device 100 further comprises state-establishing means 104 for establishing a coding state of the $m_1$-bit channel words and of the $m_2$-bit channel words. Using this coding state the converter 102 can convert the next n-bit information word. In order to be able to influence predetermined properties of the binary channel, the converter 102 comprises substitution means for possibly substituting a limited number of channel words with substitute channel words or patterns.

Figure 8:
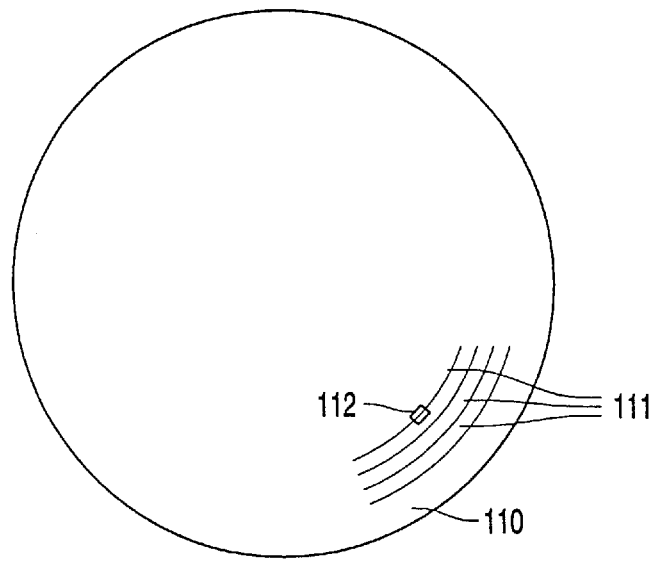
FIG. 8 shows a record carrier on which a signal comprising a stream of databits of a constrained binary channel signal, obtained after carrying out a method according to the invention is recorded in a track.
Figure 9:
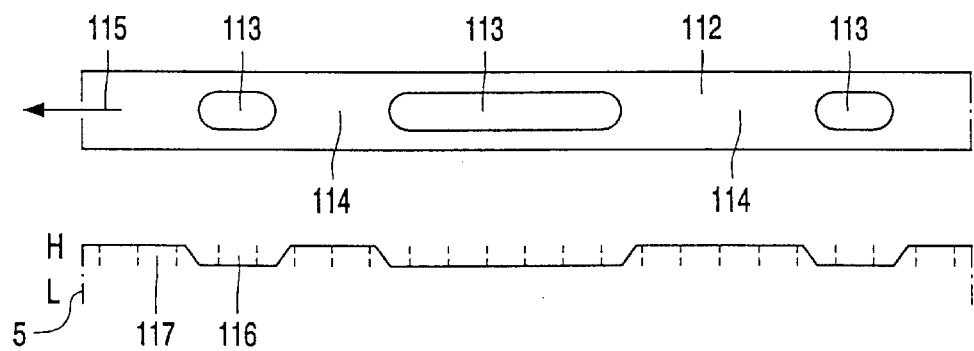
FIG. 9 shows an enlarged portion of the record carrier of FIG. 8.

FIG. 8 shows, by way of example, a record carrier 110 on which a signal comprising a stream of databits of a constrained binary channel signal, obtained after carrying out a method according to the invention is recorded in a track. FIG. 9 shows an enlarged portion of the record carrier of FIG. 8. The record carrier shown is one of an optically detectable type. The record carrier may also be of a different type, for example, of a magnetically readable type. The record carrier comprises information patterns arranged in tracks 111. FIG. 9 shows an enlarged portion 112 of one of the tracks 111. The information pattern in the track portion 112 shown in FIG. 9 comprises first sections 113, for example, in the form of optically detectable marks and second sections 114, for example, intermediate areas lying between the marks. The first and second sections alternate in a direction of the track 115. The first sections 113 present first detectable properties and the second sections 114 present second properties which are distinguishable from the first detectable properties, The first sections 113 represents bit cells 116 of the modulated binary signal S having one signal level, for example the low signal level L. The second sections 114 represent bit cells 117 having the other signal level, for example the high signal level H. The record carrier 110 may be obtained by first generating the modulated binary channel signal and then providing the record carrier with the information pattern. If the record carrier is an optically detectable type, the record carrier can then be obtained with mastering and replica techniques known to a person skilled in the art.

Figure 10:
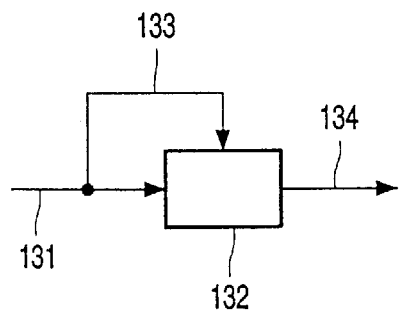
FIG. 10 shows a device for decoding.

FIG. 10 shows a device for decoding. In this decoding device 132, a stream of databits of a constrained binary channel signal 131 is converted into a stream of databits of a binary information signal 134. The decoding device 132 comprises a converter for converting the constrained binary channel signal 131 into the stream of databits of a binary information signal. Decoding can, for example, be accomplished by using a hashing-technique as described in and with reference to FIG. 5. When decoding the binary channel signal 131, information about the next channel word to be decoded is needed, as is explained in and with reference to FIG. 5. This information 133 is supplied to the decoding device 132 before decoding the present channel word.

Figure 11:
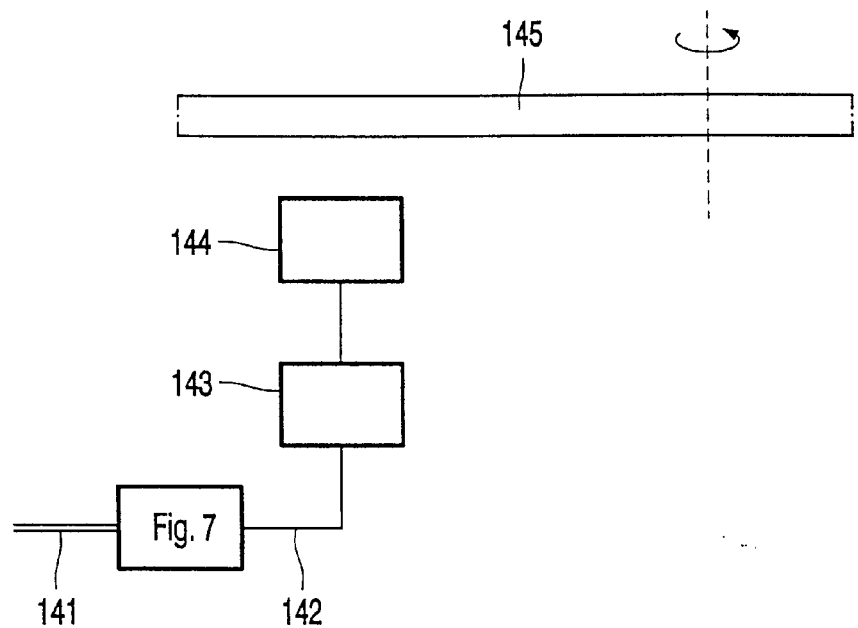
FIG. 11 shows a recording device for recording information.

FIG. 11 shows a recording device for recording information. The Figure shows a recording device for recording information, in which a device for encoding is used, for example the device for encoding 100 shown in FIG. 7. The signal line 141 delivers the information words to be encoded to the device for encoding 100. In the recording device the signal line 142 for delivering the modulated binary channel signal is connected to a control circuit 143 for a write head 144 along which a record carrier 145 of a writable type is moved. The write head 144 is of a customary type capable of introducing marks having detectable changes on the record carrier 145. The control circuit 143 may also be of a customary type generating a control signal for the write head in response to the modulated signal applied to the control circuit 143, so that the write head 144 introduces a pattern of marks that corresponds to the modulated signal.

Figure 12:
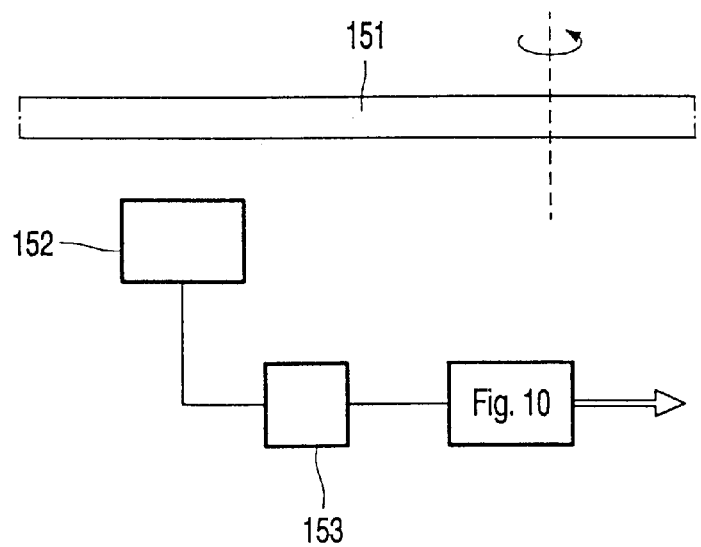
FIG. 12 shows a reading device for reading out a record carrier.

FIG. 12 shows a reading device for reading out a record carrier. This Figure shows a reading device in which a device for decoding is used, for example the decoding device 132 shown in FIG. 10. The reading device comprises a read head 152 of a customary type for reading out a record carrier 151 according to the invention which record carrier 151 carries an information pattern that corresponds to the modulated binary channel signal according to the invention. The read head 152 then produces an analogue read signal modulated according to the information pattern read out by the read head 152. Detection circuit 153 converts this read signal in customary fashion to a binary signal, which is applied to the decoding circuit 132.

Whilst the invention has been described with reference to preferred embodiments therefor, it is to be understood that these are not limitative examples. Thus, various modifications may become apparent to those skilled in the art, without departing from the scope of the invention, as defined by the claims.

For example the scope of the invention is not limited to a binary code. Without deviating from the gist of the invention, the substitutions according to the invention can be applied to multi-level codes, ternary codes or other M-ary codes. The number of different $m_2$-bit channel words for each n-bit information word must at least be two and in an advantageous situation, this number is equal to the number of values of the multivalued "parity"-parameter, while the "parities" of the channel words must at least cover all the different values at least once. In the case of a ternary code (with values −1, 0 and 1) at least three different $m_2$-bit channel words with "parities" −1, 0 and 1 must be present in the certain channel code $C_2$ (with the same next-state).

Furthermore, the invention resides in each and every novel characteristic feature or each and every combination of characteristic features.

What is claimed is:

1. A method of converting a stream of databits of a binary information signal into a stream of databits of a constrained binary channel signal, the method comprising:

converting each n-bit information word of a binary information signal into a channel word such that the binary channel signal includes a sequence of channel words; and substituting, in dependence upon a value of a predetermined property of the binary channel signal, a channel word for a substitute channel word so as to influence the value of the predetermined property of the binary channel signal, wherein the substituted channel word and the substitute channel word establish a same state:

wherein each said channel word is selected from the group consisting of an $m_1$-bit channel word in accordance with a channel code $C_1$ and an $m_2$-bit channel word in accordance with a channel code $C_2$, wherein n, $m_1$, and $m_2$ are positive integers such that $m_2 > m_1 > n$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein converting said n-bit information word into said $m_1$-bit channel word comprises selecting a set of $m_1$-bit channel words from a plurality of sets of $m_1$-bit channel words followed by selecting said $m_1$-bit channel word from said set of $m_1$-bit channel words, each set of $m_1$-bit channel words being associated with a coding state of said channel code $C_1$, said coding state of said channel code $C_1$ being established in dependence upon an end part of the preceding channel word in said sequence of channel words, wherein converting said information word into said $m_2$-bit channel word comprises selecting a set of $m_2$-bit channel words from a plurality of sets of $m_2$-bit channel words followed by selecting said $m_1$-bit channel word from said set of $m_2$-bit channel words, each set of $m_2$-bit channel words being associated with a coding state of said channel code $C_2$, said coding state of said channel code $C_2$ being established in dependence upon an end part of the preceding channel word in said sequence of channel words, and wherein end parts of the $m_1$-bit channel words in a coding state of channel code $C_1$ and beginning parts of the $m_2$-bit channel words in a coding state of channel code $C_2$ are arranged to comply with said runlength constraint.

2. The method of claim 1, wherein substituting a channel word for a substitute channel word is in accordance with a type of substituting, and wherein the type of substituting is one of at least two types of substituting.

3. The method of claim 2, wherein said substituting comprises maximally one type of substituting for each information word.

4. The method as claimed in claim 1, wherein the substitute channel word does not belong to either of the sets of $m_1$-bit and $m_2$-bit channel words.

5. The method of claim 1, wherein the substitute channel word is omitted from sets of $m_1$-bit and $m_2$-bit channel words in view of a constraint on the number of successive xT runlengths in the binary channel signal.

6. The method of claim 5, wherein x=3.

7. The method of claim 5, wherein the number of successive xT runlengths is 6.

8. The method of claim 1, wherein the substitute channel word is chosen from one set out of a plurality of sets of channel words, the one set being associated with a coding state different from the coding state that the substituted channel word was in.

9. A device for encoding a stream of databits of a binary information signal into a stream of databits of a constrained binary channel signal, said binary information signal comprising n-bit information words, said binary channel signal comprising a sequence of channel words, said sequence of channel words comprising $m_1$-bit channel words and $m_2$-bit channel words, the device comprising:

an n-to-$m_1$-bit converter for converting the n-bit information words into corresponding $m_1$-bit channel words, an n-to-$m_2$-bit converter for converting the n-bit information words into corresponding $m_2$-bit channel words, state-establishing means for establishing a coding state of the $m_1$-bit channel words and of the $m_2$-bit channel words, wherein the n-to-$m_1$ bit converter is additionally arranged to select the $m_1$-bit channel word depending on an end part of the preceding channel word in said sequence of channel words, wherein the n-to-$m_2$ bit converter is additionally arranged to select the $m_2$-bit channel word depending on an end part of the preceding channel word in said sequence of channel words, wherein n, $m_1$, and $m_2$ are positive integers such that $m_2 > m_1 > n$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of a channel code $C_1$, said coding state of said channel code $C_1$ being established in dependence upon an end part of the preceding channel word in said sequence of channel words, wherein each $m_2$-bit channel word is associated with a coding state of a channel code $C_2$, said coding state of said channel code $C_2$ being established in dependence upon an end part of the preceding channel word in said sequence of channel words, and wherein end parts of the $m_1$-bit channel words in a coding state of channel code $C_1$ and beginning parts of the $m_2$-bit channel words in a coding state of channel code $C_2$ are arranged to comply with said runlength constraint, and wherein at least one of the n-to-$m_1$-bit converter and the n-to-$m_2$-bit converter comprises substitution means for substituting a limited number of channel words for substitute channel words so as to influence predetermined properties of the binary channel signal, the substituted channel word and the substitute channel word establishing the same state.

10. The device of claim 9, wherein the device further comprises writing means for writing an information pattern on a record carrier, and wherein the information pattern comprises databits of the stream of databits of the constrained binary channel signal.

11. A constrained binary channel signal comprising a sequence of channel words:

wherein each said channel word is selected from the group consisting of an $m_1$-bit channel word in accordance with a channel code $C_1$ and an $m_2$-bit channel word in accordance with a channel code $C_2$, wherein $m_1$ and $m_2$ are positive integers such that $m_2 > m_1$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $M_2$-bit channel words, wherein said concatenated $m_1$-bit channel words and $m_2$-bit channel words comply with a runlength constraint of the binary channel signal, wherein each $m_1$-bit channel word is associated with a coding state of said channel code $C_1$, said coding state of said channel code $C_1$ being established in dependence upon an end part of the preceding channel word in said sequence of channel words, wherein each $m_2$-bit channel word is associated with a coding state of said channel code $C_2$, said coding state of said channel code $C_2$ being established in dependence upon an end part of the preceding channel word in said sequence of channel words, wherein end parts of the $m_1$-bit channel words in a coding state of channel code $C_1$ and beginning parts of the $m_2$-bit channel words in a coding state of channel code $C_2$ are arranged to comply with said runlength constraint, and wherein, in dependence upon a value of a predetermined property of the binary channel signal, a channel word substitutes for a substitute channel word so as to influence the value of the predetermined property of the binary channel signal, wherein the substituted channel word and the substitute channel word establish a same state.

12. A record carrier, comprising tracks having an information pattern recorded therein:

wherein the information pattern represents a portion of a constrained binary channel signal, wherein the information pattern comprises first parts and second parts alternating in the direction of a track of said tracks, wherein the first parts represent first bit cells of the binary channel signal such that the first bit cells have a low signal level, wherein the second parts represent first bit cells of the binary channel signal such that the first bit cells have a high signal level, wherein the portion of the constrained binary channel signal comprises a sequence of channel words, wherein each said channel word is selected from the group consisting of an $m_1$-bit channel word in accordance with a channel code $C_1$ and an $m_2$-bit channel word in accordance with a channel code $C_2$, wherein $m_1$ and $m_2$ are positive integers such that $m_2 > m_1$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of said channel code $C_1$, said coding state of said channel code $C_1$ being established in dependence upon an end part of the preceding channel word in said sequence of channel words, wherein each $m_2$-bit channel word is associated with a coding state of said channel code $C_2$, said coding state of said channel code $C_2$ being established in dependence upon an end part of the preceding channel word in said sequence of channel words, wherein end parts of the $m_1$-bit channel words in a coding state of channel code $C_1$ and beginning parts of the $m_2$-bit channel words in a coding state of channel code $C_2$ are arranged to comply with said runlength constraint, and.

wherein, in dependence upon a value of a predetermined property of the binary channel signal, a channel word substitutes for a substitute channel word so as to influence the value of the predetermined property of the binary channel signal, wherein the substituted channel word and the substitute channel word establish a same state.

13. A method of decoding a stream of databits of a constrained binary channel signal into a stream of databits of a binary information signal that includes n-bit information words, the method comprising converting the constrained binary channel signal into the binary information signal:

wherein the binary information signal includes a sequence of channel words, wherein one of said n-bit information words is generated from each of said channel words, wherein each said channel word is selected from the group consisting of an $m_1$-bit channel word in accordance with a channel code $C_1$ and an $m_2$-bit channel word in accordance with a channel code $C_2$, wherein $m_1$ and $m_2$ are positive integers such that $m_2 > m_1$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of said channel code $C_1$, said coding state of said channel code $C_1$ being established in dependence upon an end part of the preceding channel word in said sequence of channel words, wherein each $m_2$-bit channel word is associated with a coding state of said channel code $C_2$, said coding state of said channel code $C_2$ being established in dependence upon an end part of the preceding channel word in said sequence of channel words, wherein end parts of the $m_1$-bit channel words in a coding state of channel code $C_1$ and beginning parts of the $m_2$-bit channel words in a coding state of channel code $C_2$ are arranged to comply with said runlength constraint, wherein, in dependence upon a value of a predetermined property of the binary channel signal, a channel word substitutes for a substitute channel word so as to influence the value of the predetermined property of the binary channel signal, wherein the substituted channel word and the substitute channel word establish a same state, and wherein, during said converting, one n-bit information word is assigned to one channel word or to one substitute channel word.

14. A device for decoding a stream of databits of a constrained binary channel signal into a stream of databits of a binary information signal that includes n-bit information words, the device comprising converting means for converting the constrained binary channel signal into the binary information signal:

wherein the binary information signal includes a sequence of channel words, wherein one of said n-bit information words is generated from each of said channel words, wherein each said channel word is selected from the group consisting of an $m_1$-bit channel word in accordance with a channel code $C_1$ and an $m_2$-bit channel word in accordance with a channel code $C_2$, wherein $m_1$ and $m_2$ are positive integers such that $m_2 > m_1$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of said channel code $C_1$, said coding state of said channel code $C_1$ being established in dependence upon an end part of the preceding channel word in said sequence of channel words, wherein each $m_2$-bit channel word is associated with a coding state of said channel code $C_2$, said coding state of said channel code $C_2$ being established in dependence upon an end part of the preceding channel word in said sequence of channel words, wherein end parts of the $m_1$-bit channel words in a coding state of channel code $C_1$ and beginning parts of the $m_2$-bit channel words in a coding state of channel code $C_2$ are arranged to comply with said runlength constraint, wherein, in dependence upon a value of a predetermined property of the binary channel signal, a channel word substitutes for a substitute channel word so as to influence the value of the predetermined property of the binary channel signal, wherein the substituted channel word and the substitute channel word establish a same state, and wherein said converting means converts one n-bit information word to one channel word or to one substitute channel word.

15. The device of claim 14, wherein the constrained binary channel signal is recorded as an information pattern on a record carrier, and wherein the device further comprises reading means for reading the information pattern from the record carrier to make the constrained binary channel signal available to the converting means.

16. A method of converting a stream of databits of a binary information signal into a stream of databits of a constrained binary channel signal, the method comprising:

converting each n-bit information word of a binary information signal into a channel word such that the binary channel signal includes a sequence of channel words; and substituting, in dependence upon a value of a predetermined property of the binary channel signal, a substituted channel word for a substitute channel word so as to influence the value of the predetermined property of the binary channel signal, wherein the substituted channel word and the substitute channel word establish a same state:

wherein each said channel word is selected from the group consisting of an $m_1$-bit channel word in accordance with a channel code $C_1$ and an $m_2$-bit channel word in accordance with a channel code $C_2$, wherein n, $m_1$, and $m_2$ are positive integers such that $m_2 > m_1 > n$.

17. The method of claim 16, wherein at least two of said $m_2$-bit channel words have opposite parities.

18. The method of claim 16, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, and wherein end parts of the $m_1$-bit channel words in a coding state of channel code $C_1$ and beginning parts of the $m_2$-bit channel words in a coding state of channel code $C_2$ are arranged to comply with said runlength constraint.

19. The method of claim 16, wherein converting said n-bit information word into said $m_1$-bit channel word comprises selecting a set of $m_1$-bit channel words from a plurality of sets of $m_1$-bit channel words followed by selecting said $m_1$-bit channel word from said set of $m_1$-bit channel words, each set of $m_1$-bit channel words being associated with a coding state of said channel code $C_1$, said coding state of said channel code $C_1$ being established in dependence upon an end part of the preceding channel word in said sequence of channel words, and wherein converting said information word into said $m_2$-bit channel word comprises selecting a set of $m_2$-bit channel words from a plurality of sets of $m_2$-bit channel words followed by selecting said $m_1$-bit channel word from said set of $m_2$-bit channel words, each set of $m_2$-bit channel words being associated with a coding state of said channel code $C_2$, said coding state of said channel code $C_2$ being established in dependence upon an end part of the preceding channel word in said sequence of channel words.

20. A device for encoding a stream of databits of a binary information signal [ into a stream of databits of a constrained binary channel signal, said binary information signal comprising n-bit information words, said binary channel signal comprising a sequence of channel words, said sequence of channel words comprising $m_1$-bit channel words and $m_2$-bit channel words, the device comprising:

an n-to-$m_1$-bit converter for converting the n-bit information words into corresponding $m_1$-bit channel words, an n-to-$m_2$-bit converter for converting the n-bit information words into corresponding $m_2$-bit channel words, state-establishing means for establishing a coding state of the $m_1$-bit channel words and of the $m_2$-bit channel words, wherein n, $m_1$, and $m_2$ are positive integers such that $m_2 > m_1 > n$, and wherein at least one of the n-to-$m_1$-bit converter and the n-to-$m_2$-bit converter comprises substitution means for substituting a limited number of substituted channel words for substitute channel words so as to influence predetermined properties of the binary channel signal, the substituted channel word and the substitute channel word establishing the same state.

21. The method of claim 20, wherein the n-to-$m_1$ bit converter is additionally arranged to select the $m_1$-bit channel word depending on an end part of the preceding channel word in said sequence of channel words, and wherein the n-to-$m_2$ bit converter is additionally arranged to select the $m_2$-bit channel word depending on an end part of the preceding channel word in said sequence of channel words.

* * * * *